(12) United States Patent
Hashemi et al.

(10) Patent No.: US 10,998,419 B2
(45) Date of Patent: *May 4, 2021

(54) SINGLE CRYSTALLINE EXTRINSIC BASES FOR BIPOLAR JUNCTION STRUCTURES

(71) Applicant: International Business Machines Corporation, Armonk, NY (US)

(72) Inventors: Pouya Hashemi, White Plains, NY (US); Tak Ning, Yorktown Heights, NY (US); Jeng-Bang Yau, Yorktown Heights, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 16/563,102

(22) Filed: Sep. 6, 2019

(65) Prior Publication Data
US 2020/0066876 A1 Feb. 27, 2020

Related U.S. Application Data

(63) Continuation of application No. 15/979,649, filed on May 15, 2018, now Pat. No. 10,483,368.

(51) Int. Cl.
*H01L 29/66* (2006.01)
*H01L 21/265* (2006.01)
(Continued)

(52) U.S. Cl.
CPC .. *H01L 29/66242* (2013.01); *H01L 21/02532* (2013.01); *H01L 21/02609* (2013.01); *H01L 21/26513* (2013.01); *H01L 21/26586* (2013.01); *H01L 21/28518* (2013.01); *H01L 21/30625* (2013.01); *H01L 29/045* (2013.01);
(Continued)

(58) Field of Classification Search
CPC ......... H01L 29/66242; H01L 21/02532; H01L 21/02609; H01L 21/26513; H01L 21/26586
See application file for complete search history.

(56) References Cited

U.S. PATENT DOCUMENTS 5,098,638 A * 3/1992 Sawada ............... H01L 21/2257
148/DIG. 123
7,038,249 B2 * 5/2006 Suligoj ............... H01L 29/1008
257/183

(Continued)

OTHER PUBLICATIONS

Cai et al., "Complementary Thin-Base Symmetric Lateral Bipolar Transistors on SOI," IEEE IEDM Technical Digest, pp. 386-389 (2011) [Abstract Only].

(Continued)

*Primary Examiner* — Zandra V Smith
*Assistant Examiner* — Andre C Stevenson
(74) *Attorney, Agent, or Firm* — Patterson + Sheridan, LLP

(57) ABSTRACT

Bipolar junction transistor structures and methods for making the same are provide. The method includes: providing a substrate with an insulator layer and a device layer over the insulator layer, forming an intrinsic base from the device layer, forming emitter and collector regions from the device layer, and after forming i) the intrinsic base and ii) the emitter and collector regions, depositing a single crystalline extrinsic base over the intrinsic base.

20 Claims, 16 Drawing Sheets

(51) Int. Cl.
    *H01L 21/306* (2006.01)
    *H01L 21/285* (2006.01)
    *H01L 29/737* (2006.01)
    *H01L 21/02* (2006.01)
    *H01L 29/04* (2006.01)
    *H01L 29/10* (2006.01)
    *H01L 29/165* (2006.01)
    *H01L 29/45* (2006.01)

(52) U.S. Cl.
    CPC ........ *H01L 29/1008* (2013.01); *H01L 29/165* (2013.01); *H01L 29/45* (2013.01); *H01L 29/737* (2013.01)

(56) References Cited

U.S. PATENT DOCUMENTS

| 8,557,670 | B1 | 10/2013 | Cai et al. | |
|---|---|---|---|---|
| 9,312,370 | B2* | 4/2016 | Adkisson | H01L 29/732 |
| 10,355,135 | B2* | 7/2019 | Chang | H01L 21/31144 |
| 2003/0160301 | A1* | 8/2003 | Furukawa | H01L 27/0652 257/539 |
| 2018/0277657 | A1* | 9/2018 | Yang | H01L 21/76822 |

OTHER PUBLICATIONS

Ning et al., "On the Performance and Scaling of Symmetric Lateral Bipolar Transistors on SOI," IEEE J. EDS, vol. 1, pp. 21-27, 2013.

Ning, "A Perspective on Future Nanoelectronic Devices," Invited Plenary Paper, 2013 International Symposium on VLSI Technology, Systems and Applications (VLSI-TSA), Proc. Technical Papers, pp. 153-154.

U.S. Appl. No. 15/979,649 "Single Crystalline Extrinsic Bases for Bipolar Junction Structures," filed May 15, 2018.

IBM, List of IBM Patents or Patent Applications Treated as Related, for U.S. Appl. No. 16/563,102, filed Sep. 6, 2019.

* cited by examiner

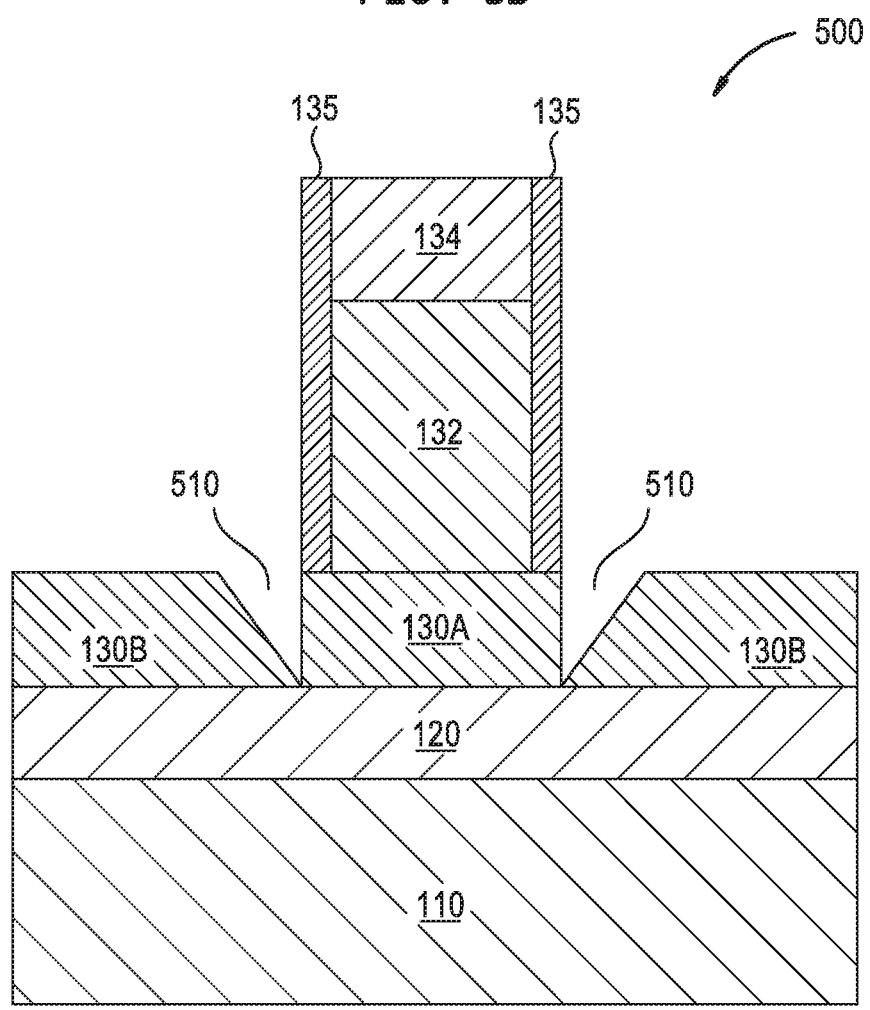

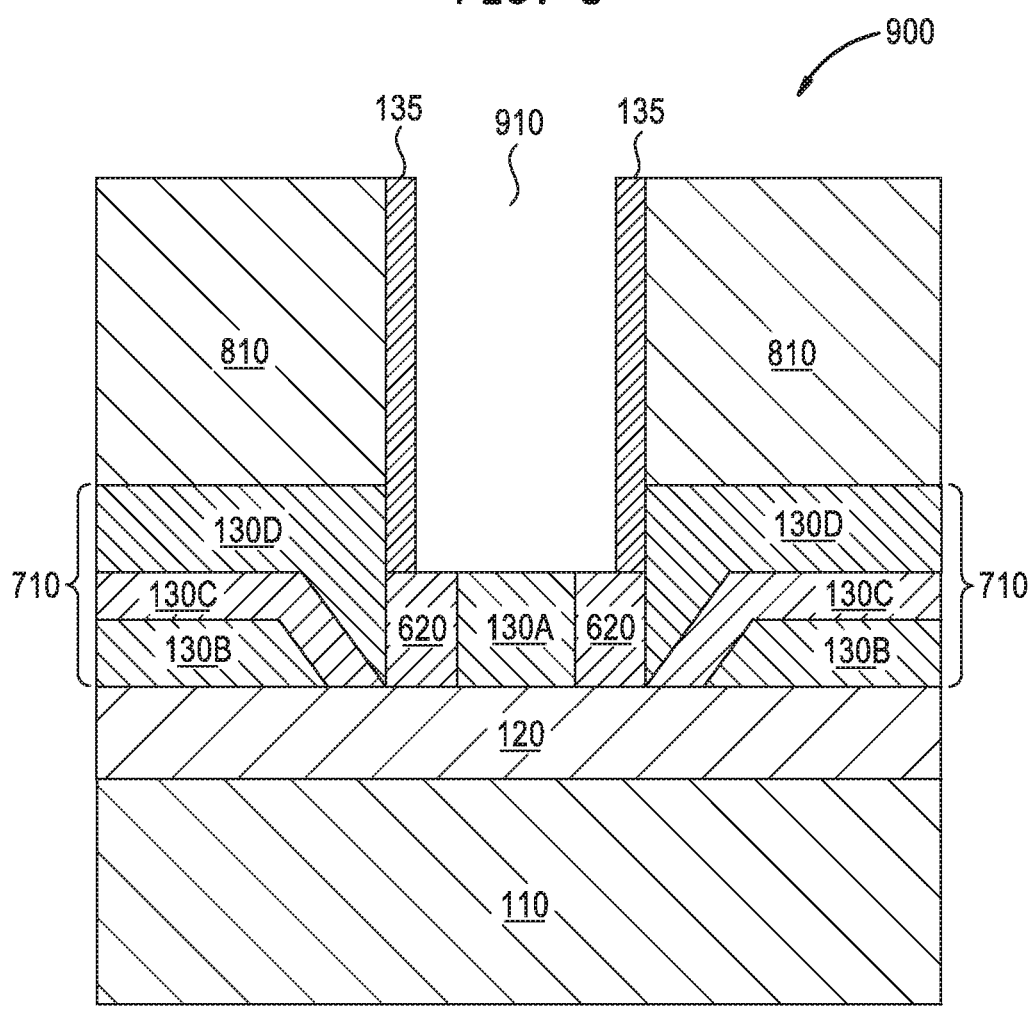

SINGLE CRYSTALLINE EXTRINSIC BASES FOR BIPOLAR JUNCTION STRUCTURES

CROSS-REFERENCE TO RELATED APPLICATIONS

This application is a continuation of co-pending U.S. patent application Ser. No. 15/979,649, filed on May 15, 2018. The aforementioned related patent application and patents are herein incorporated by reference in their entirety.

BACKGROUND

Field of the Invention

The exemplary embodiments described herein relate generally to semiconductor devices and methods for the fabrication thereof and, more specifically, to bipolar junction transistors with single crystalline layers and methods for making the same.

Related Art

A bipolar junction transistor (BJT) is a semiconductor device comprising three sections of semiconductor material arranged to alternate between P-type and N-type, the sections of semiconductor material forming a base, an emitter, and a collector, thus resulting in a three-region device having an emitter region, a base region, and a collector region having two P-N junctions with one P-N junction being between the emitter and the base and the other P-N junction being between the collector and the base. Each bipolar junction transistor is thus classified as either PNP or NPN according to the arrangement of the P-type material and N-type material. An NPN BJT has an N-type emitter, a P-type base, and an N-type collector, and a PNP BJT has a P-type emitter, an N-type base, and a P-type collector. One function of a BJT is to amplify current so that the collector current (output signal) is larger than the base current (input signal). In a lateral BJT, the base is located between the emitter and the collector channels, with the emitter/base junction and the collector/base junction being formed between laterally arranged components.

SUMMARY

One aspect of the present disclosure includes a method for making a bipolar-junction transistor (BJT) structure. The method includes: providing a substrate with an insulator layer and a device layer over the insulator layer, forming an intrinsic base from the device layer, forming emitter and collector regions from the device layer, and after forming i) the intrinsic base and ii) the emitter and collector regions, depositing a single crystalline extrinsic base over the intrinsic base.

Another aspect of the present disclosure includes a bipolar-junction transistor structure (BJT). The structure includes: a substrate, an intrinsic base over the substrate, a plurality of spacers over the intrinsic base, emitter and collector regions present on opposing sides of the intrinsic base, and a single crystalline extrinsic base over the intrinsic base.

BRIEF DESCRIPTION OF THE SEVERAL VIEWS OF THE DRAWINGS

FIG. 5B illustrates at least one embodiment of a structure resulting after the etching process according to FIG. 5A is performed in accordance with at least one embodiment of the present disclosure.

FIG. 9 illustrates an etch process for forming an opening suitable to deposit and/or form an extrinsic base in accordance with at least one embodiment of the present disclosure.

DETAILED DESCRIPTION

Figure 1:
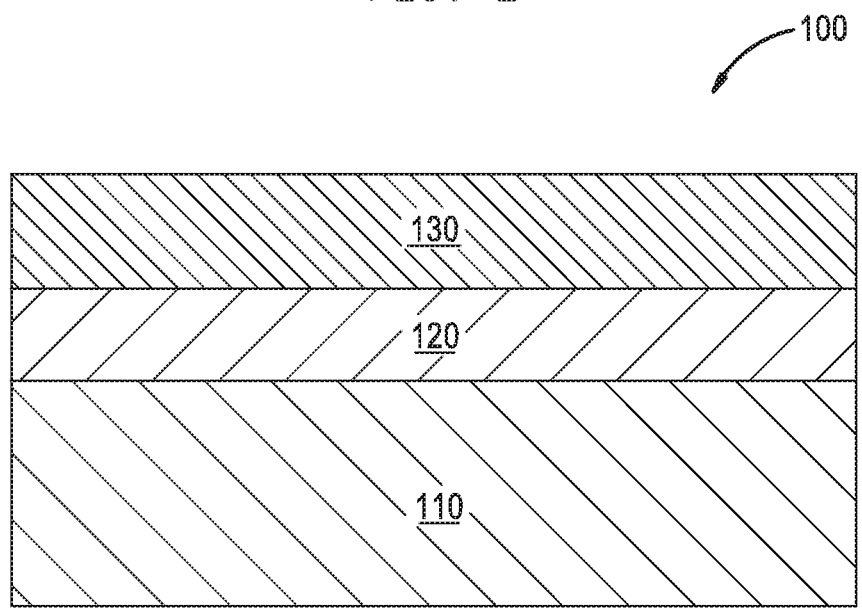
FIG. 1 illustrates a substrate structure that can be used with at least one embodiment of the present disclosure.

It is noted that the drawings of the present application are provided for illustrative purposes and, as such, they are not drawn to scale. In the drawings and the description that follows, like materials are referred to by like reference numerals. For purposes of the description hereinafter, the terms "upper", "lower", "right", "left", "vertical", "horizontal", "top", "bottom", and derivatives thereof shall relate to the components, layers and/or materials as oriented in the drawing figures which accompany the present application.

In the following description, numerous specific details are set forth, such as particular structures, components, materials, dimensions, processing steps and techniques, in order to provide a thorough understanding of the present disclosure. However, it will be appreciated by one of ordinary skill in the art that the present disclosure may be practiced with viable alternative process options without these specific details. In other instances, well-known structures or processing steps have not been described in detail in order to avoid obscuring the various embodiments of the present disclosure.

Disclosed herein are bipolar junction transistor structures (BJT), including lateral bipolar junction transistors (LBJTs), and methods for the fabrication of the same. Pursuant to at least one embodiment, an extrinsic base of a BJT is formed towards the end of the BJT fabrication process. For example, the extrinsic base can be formed after formation of several other layers, portions and/or regions of the BJT, including one or more of an intrinsic base, one or more spacers over the intrinsic base, emitter/collector region(s), and an interlayer-dielectric material (ILD). Forming an extrinsic base towards the end of the BJT fabrication process offers one or more advantages in relation to conventional techniques. For example, certain processing steps, such as steps that implicate temperatures greater or equal to 700 degrees Celsius, can cause dopant diffusion between layers in the BJT device, e.g. between the extrinsic base and the intrinsic base, but this disadvantage is avoided by forming the extrinsic base towards the end of the fabrication process. Moreover, since adverse effects associated with dopant diffusion are remedied by forming the extrinsic base towards the end, greater flexibility is afforded with respect to the dopant concentration used for the extrinsic base and other portions of the device. Another advantage of at least one embodiment of the present disclosure is forming a single crystalline extrinsic base. The single crystalline structure offers advantages over devices employing polycrystalline extrinsic bases, including providing an ability for greater current conduction. In one embodiment, the single crystalline extrinsic base has a facet(s). This feature can offer one or more advantages, in addition to what is offered by the single crystalline extrinsic base, e.g. the crystal orientation of the facet(s) can provide greater flexibility during contact formation. For example, by controlling epitaxial conditions during formation of the extrinsic base, the crystal orientation of the facet(s) can be determined or developed, as necessary, which in turn can provide greater flexibility in forming/determining the contact area of the contacts associated with capping the extrinsic base, (e.g., one or more contacts of the completed BJT structure).

Referring to FIG. 1, a starting substrate 100 on which lateral BJTs may be fabricated is provided. The substrate 100 may include a handle substrate 110, which can be a bulk silicon material and/or may include a buried oxide (BOX) layer 120 of silicon dioxide ($SiO_2$) or semi-insulating III-V material 120, e.g. indium aluminum arsenic (InAlAs), thereon, over which a device layer 130 is provided. The handle substrate 110 and device layer 130 can include any suitable Group IV, III-V, and/or II-VI semiconductor material, including but not limited to silicon (Si), germanium (Ge), silicon germanium (SiGe), indium phosphide (InP), indium gallium arsenide (InGaAs), gallium arsenide (GaAs), indium antimonide (InSb), indium arsenide (InAs), indium gallium phosphide (InGaP), aluminum indium arsenide (AlInAs), CdSe (cadmium selenide), CdS (cadmium sulfide), CdTe (cadmium telluride), ZnSe (zinc selenide), ZnS (zinc sulfide), or ZnTe (zinc telluride), and combinations thereof. In some embodiments, the application of at least some of the foregoing exemplary materials can result in using a germanium-on-insulator (GeOI) substrate, a silicon-on-insulator (SOI) substrate, or a SiGe-on-insulator (SGOI) substrate. Bulk substrates with counter-doped/PTS layers can also be employed, e.g. a SiGe substrate with a PTS-Silicon layer. Device layer 130 may have a doping of p-type for a lateral NPN BJT, or a doping of n-type for a lateral PNP BJT. Device layer 130 can be doped in-situ during epitaxial growth or doped by ion implantation after epitaxial growth. For Group IV semiconductors, suitable n-type dopants include arsenic, phosphorus, antimony, and for Group III-V semiconductors, suitable n-type dopants include tellurium and selenium. For Group IV semiconductors, suitable p-type dopants include boron, aluminum, and gallium, and for Group III-V semiconductors, suitable p-type dopants include zinc and magnesium.

In one or more embodiments in accordance with the present disclosure, substrate 100 has a <100> crystallographic orientation which can more easily provide for the faceted options for one or more faceted layers as discussed below, although other orientations are possible depending on design objectives.

Figure 2:
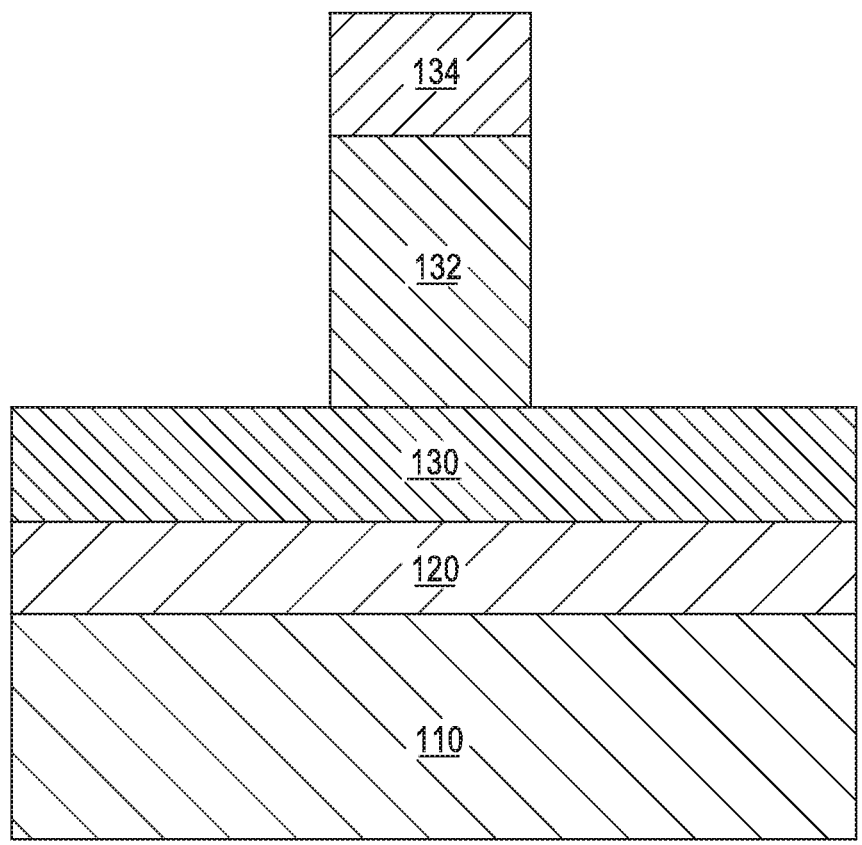
FIG. 2 illustrates forming a dummy or sacrificial material and hardmask in accordance with at least one embodiment of the present disclosure.

FIG. 2 illustrates depositing a dummy base 132 over the substrate 100 and a hard mask 134 over the dummy base 132, in order to form a structure 200. The dummy base 132 can be formed by processes known in the art, including masking, patterning, etching, deposition, and planarization processes/steps. The dummy base 132 can be a material that can be easily and selectively removed with respect to underlying layers, e.g. the layers of the substrate 100, including, but not limited to, poly-silicon (p-Si), amorphous silicon (a-Si), amorphous carbon (a-C). In one embodiment, the dummy base 132 may include multiple material layers (not shown), e.g., a capping layer, where the dummy base 132 can be a dummy base stack. A hardmask 134 is deposited over the dummy base 132 using any suitable deposition technique, where the hardmask 134 can be a nitride, e.g. silicon nitride, or other suitable hardmask material. Although not expressly shown, in one embodiment, the material constituting the dummy base 132 would cover most and/or all of layer 130, and it is reduced to a suitable size using a suitable etch and patterning process, e.g. reactive-ion etching, as shown and after deposition of the hardmask 134, where after recessing, the dummy base 132 covers a portion of layer 130 that will constitute the base of a final BJT structure.

Figure 3:
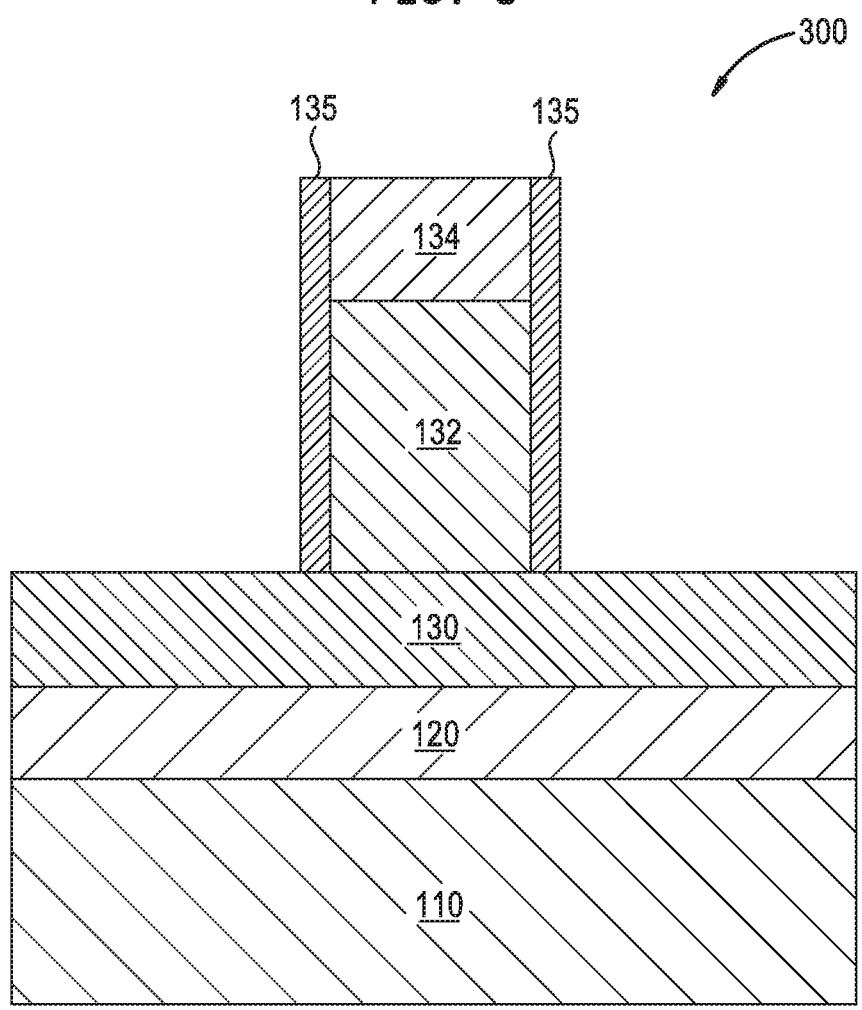
FIG. 3 illustrates forming a spacer in accordance with at least one embodiment of the present disclosure.

FIG. 3 illustrates the structure 200 of FIG. 2 with spacers deposited on the sidewalls of structure 200, resulting in a structure 300. In one embodiment, a side spacer 135 can be formed on the sides of the dummy base 132, where the side spacer 135 can be conformally deposited on the dummy base 132, hardmask 134, and exposed surfaces of the device layer 130, and etched back using a directional etch (e.g. RIE) to expose the top surface of the hard mask 134, while the side spacers 135 remain on the vertical surfaces of the dummy base 132.

In an embodiment, the side spacers 135 can be composed of a silicon nitride (SiN), a silicon oxynitride (SiON), a silicon carbonitride (SiCN), silicon oxycarbonitride (SiOCN) a silicon boronitride (SiBN), a silicon boro carbonitride (SiBCN) or combinations thereof, where the dummy base 132 can be selectively etched relative to the side spacer 135.

Figure 4:
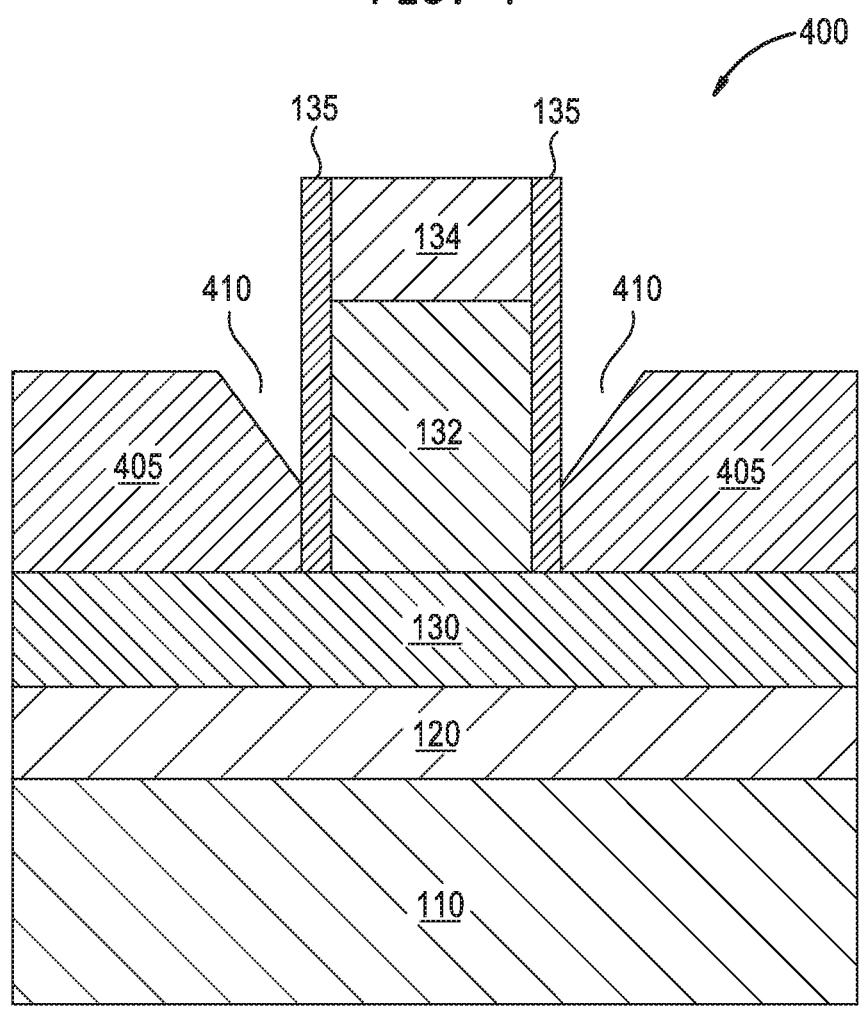
FIG. 4 illustrates forming a structure with a dummy layer in accordance with at least one embodiment of the present disclosure.

FIG. 4 illustrates forming dummy or sacrificial epitaxial layers 405 on the structure 300 in FIG. 3, resulting in a structure 400. In one embodiment, the sacrificial epitaxial layers 405 (also referred to as epitaxial dummy layers) are epitaxially grown over the device layer 130, and as such, are in an epitaxial relationship in relation to one another. The facets 410 associated with the sacrificial epitaxial layer 405 can be formed and tailored during the epitaxial deposition process by adjusting various factors associated with the process, including reactor temperature, pressure, timing, and precursor flows. In one embodiment, as shown, the facets 410 are in relation to surfaces adjacent the sidewall spacers 135.

The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed, e.g. has an epitaxial relationship (is epitaxially matched), with respect to the underlying surface.

Examples of various epitaxial growth process apparatuses that can be employed in the present application include, e.g., low pressure chemical vapor deposition (LPCVD), rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The epitaxial growth may be performed at a temperature of from 300° C. to 800° C.

In certain embodiments, depending on which material(s) is to be grown and which precursor is used, (and, as stated, whether and what kind of facets may be required), different parameters (temperature, process pressure, times, etc.) are applicable to the process.

In some embodiments, the gas source for the deposition of epitaxial semiconductor material include a silicon containing gas source, a germanium containing gas source, or a combination thereof. For example, for a Type IV semiconductor a silicon gas source or germanium source gas can be used, non-limiting examples including silane, disilane, trisilane, tetrasilane, hexachlorodisilane, tetrachlorosilane, dichlorosilane, trichlorosilane, germane, digermane, halogermane, dichlorogermane, trichlorogermane, tetrachlorogermane and combinations thereof. Carrier gases such as hydrogen, helium and argon may be used. Non-limiting examples of III-V of metalorganic precursors include trimethylgallium, trimethylaluminum, trimethylindium, trimethylantimony, tertiarybutylarsine and tertiarybutylphosphine. Alternate Group V precursors include arsine and phosphine. Other materials, gases, and sources are contemplated depending on the particular design need.

Figure 5A:
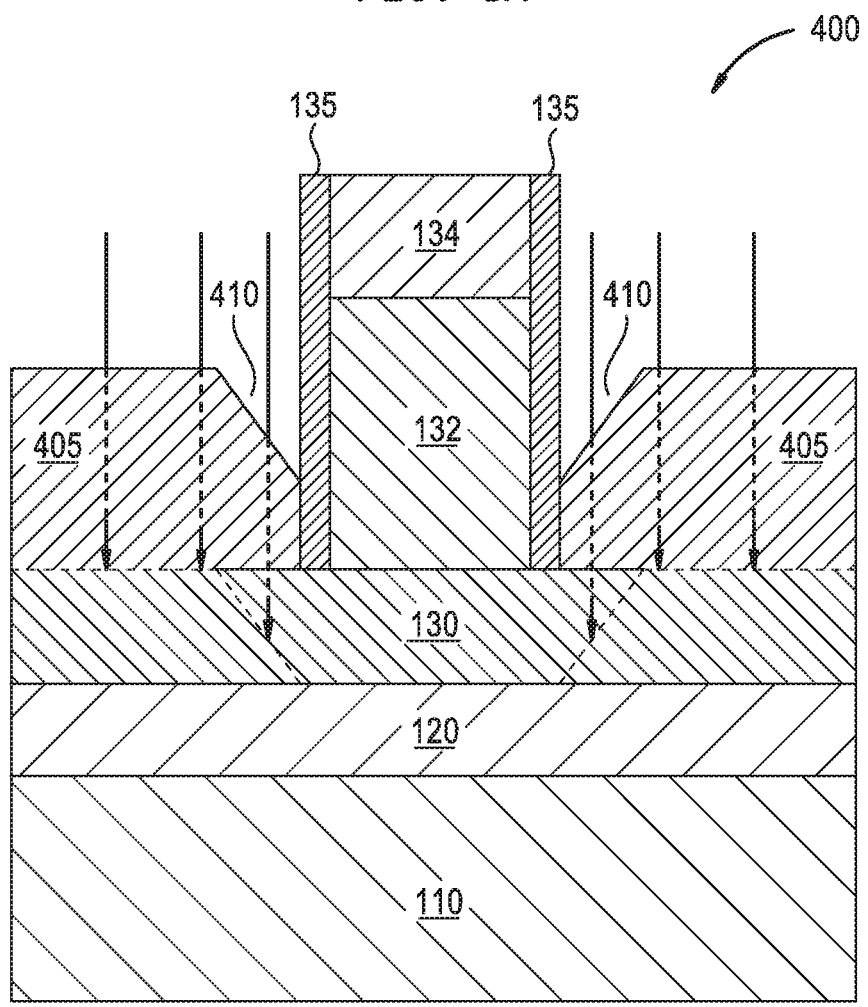
FIG. 5A illustrates an etching process in accordance with at least one embodiment of the present disclosure.

FIG. 5A illustrates a directional etching process performed on the dummy epitaxial layers 405 and the device layer 130, resulting in the structure 500 illustrated in FIG. 5B. Both the dummy epitaxial layer 405 and the device layer 130 are recessed by directional etching. The etching completely removes the epitaxially grown layers 405 and portions of the device layer 130 such that base portions of the sidewall spacers 135 are completely exposed with a portion of the device layer 130, e.g. the intrinsic base 130A (note that intrinsic base 130A and intrinsic base layer 130A are referred to interchangeably herein), remaining under the sidewall spacers 135, the dummy base 132, and the hardmask 134, and such that material layers or portions 130B for the emitter and collector regions are formed over the insulator layer 120. In doing so, the epitaxially grown layers 405 and exposed portions of the device layer 130 are removed below an upper surface of the portion of the device layer 130 under the hardmask 134, the dummy base 132, and the sidewall spacers 135. The etching is performed over the layers 405 and the device layer 130 such that facets 510 are formed in the recessed portions of the device layer 130, e.g. the facets 510 are associated with the portions 130B that will form the basis for an emitter and collector region and the remaining portion 130A forming the intrinsic base under the dummy base 132, with the facets 510 terminating on layer 120. As shown, per one embodiment, given the application of the RIE process and given the arrangement and distribution of material over layer 130, the dummy layer 405 and associated facets 410 can serve as a template for the formation of layers 130A, 130B and associated facets 510.

In one embodiment, the facets 510 serve as ion-implantation (I/I) masks, e.g. they provide a structure for better doping to-be-formed junctions. The etching also exposes portions of the layer 120 between the facets 510 and the intrinsic base 130A, e.g. the portion 130A that constitutes the intrinsic base, under the sidewall spacers 135. One suitable etching process is a partial RIE process, although any other suitable dry etch process may be used. In any etching process used, the process is a partial etch such that the layers 405 and the device layer 130 are recessed, the partial etch being terminated before the device layer 130A is completely removed.

Figure 6A:
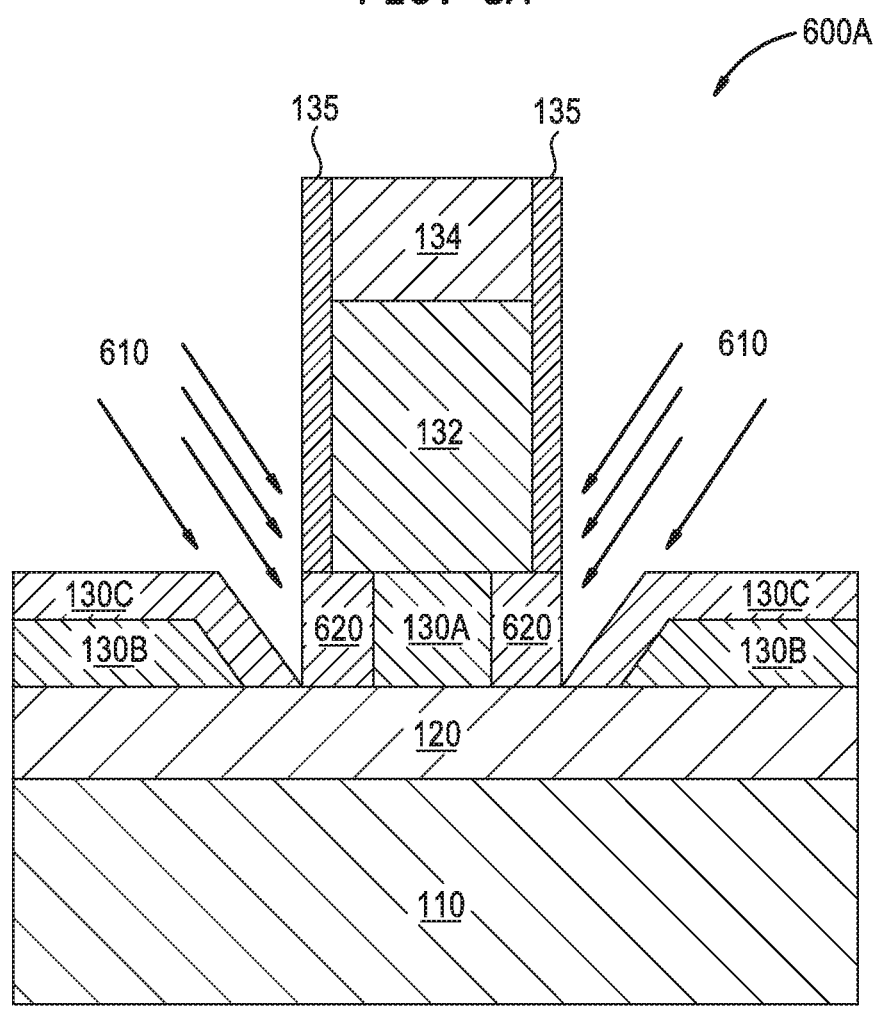
FIG. 6A illustrates an implantation process in accordance with at least one embodiment of the present disclosure.

FIG. 6A illustrates an angled I/I and anneal process performed on the structure 500 in FIG. 5B to form emitter/base and collector/base junctions 620, resulting in a structure 600. The I/I process implants appropriate ions 610 into the exposed vertical sides of the intrinsic base 130A under the sidewall spacers 135 and is carried out to form a junction edge/profile, e.g. junctions 620. Implantation of the ions 610 is to a suitable depth, e.g. several nanometers, to assist in the reduction of band-to-band tunneling in the BJT, which results in the emitter and collector portions 130B being doped and forming layers 130C, and junctions 620 also being doped, while portions of 130B and the intrinsic base 130A, e.g. under the dummy base 132, remaining undoped. As discussed above, in one embodiment, the facets 510 serve as one or more ion-implantation masks for better performing the I/I process, e.g. focusing the implantation on the appropriate portions of structure 600, e.g. the junctions 620. For Group IV semiconductors, exemplary ions for the I/I into the exposed vertical sides of the intrinsic base 130A and the emitter and collector region portions 130C include, but are not limited to, arsenic and/or phosphorous for a lateral NPN BJT, and boron difluoride ($BF_2$) or boron for a lateral PNP BJT. For Group III-V semiconductor materials ions for the I/I into the exposed vertical sides of the intrinsic base 130A include, but are not limited to, tellurium and/or selenium for a lateral NPN BJT, and zinc and/or magnesium for a lateral PNP BJT. It should be noted that any suitable p-type or n-type dopant can be used (as specified herein or otherwise suitable). In one embodiment, the dopant concentration of the junctions 620 and the emitter and collector region 130C can be between $1\times10^{16}/cm^3$ to $3\times10^{19}/cm^3$, although greater or lesser concentrations can be used.

In one embodiment, an anneal process is carried out after the I/I to form doped emitter/base and collector/base junctions 620 in the intrinsic base 130A under the sidewall spacers 135. In one embodiment, the anneal process is a low temperature junction anneal, for example, carried out at about 700 degrees C. for about 30 seconds, although higher temperature embodiments are also contemplated and are in accordance with the principles and advantages offered by at least one embodiment of the present disclosure.

Accordingly, pursuant to one or more embodiments discussed above, since the I/I and/or anneal process takes place before forming an extrinsic base (discussed below), dopant diffusion between an intrinsic base e.g. 130A, and the extrinsic base does not take place, which preserves and enhances intended device performance once an extrinsic base is ultimately formed with respect to a final BJT structure.

Figure 6B:
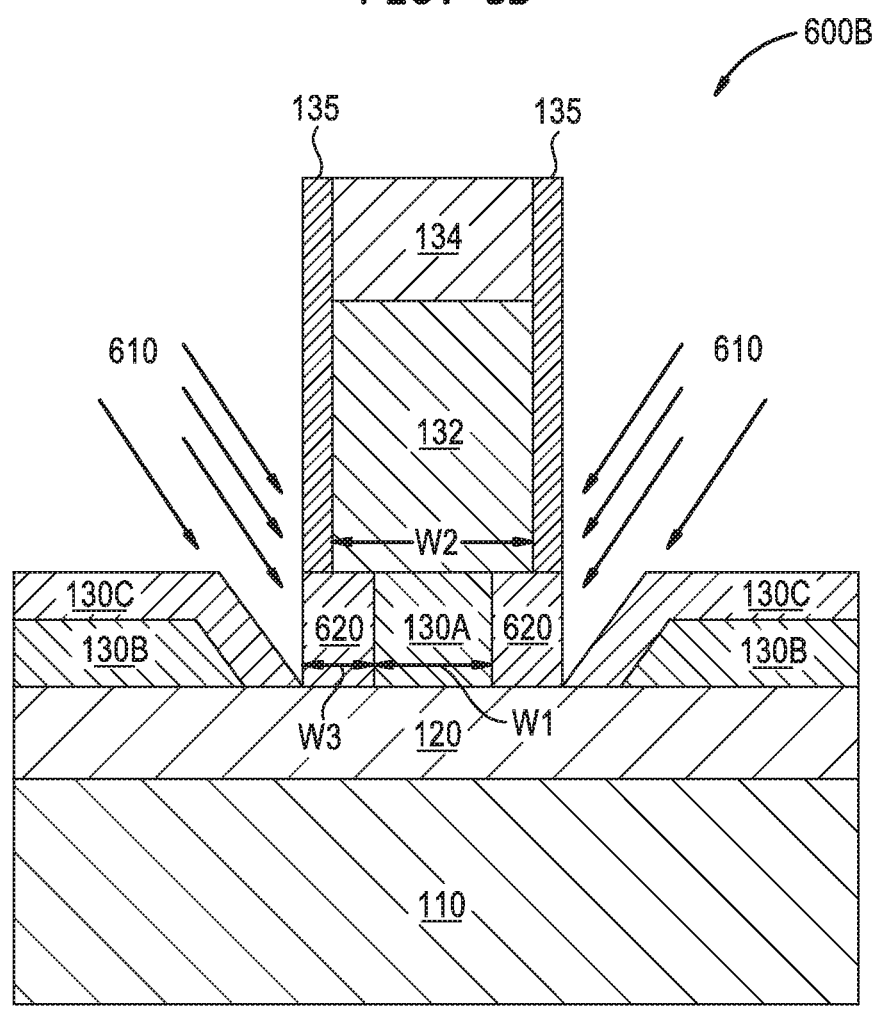
FIG. 6B illustrates specific dimensions for a structure in accordance with at least one embodiment of the present disclosure.

Furthermore, as illustrated in FIG. 6B, one embodiment is shown with specific dimensional characteristics. The techniques discussed above and herein, pursuant to this embodiment, are carried out such that width, i.e., W1, of the undoped portion of the intrinsic base 130A can be between 1 nm-15 nm, the width, i.e., W3, of the doped portions or junctions 610 of the intrinsic base 130A under the spacers 135 can be approximately 10 nm each, the width of dummy base 120, i.e., W2, can be between 12 nm and 17 nm, and the width (not shown) of each spacer 135 can between 4 nm and 8 nm.

Figure 7:
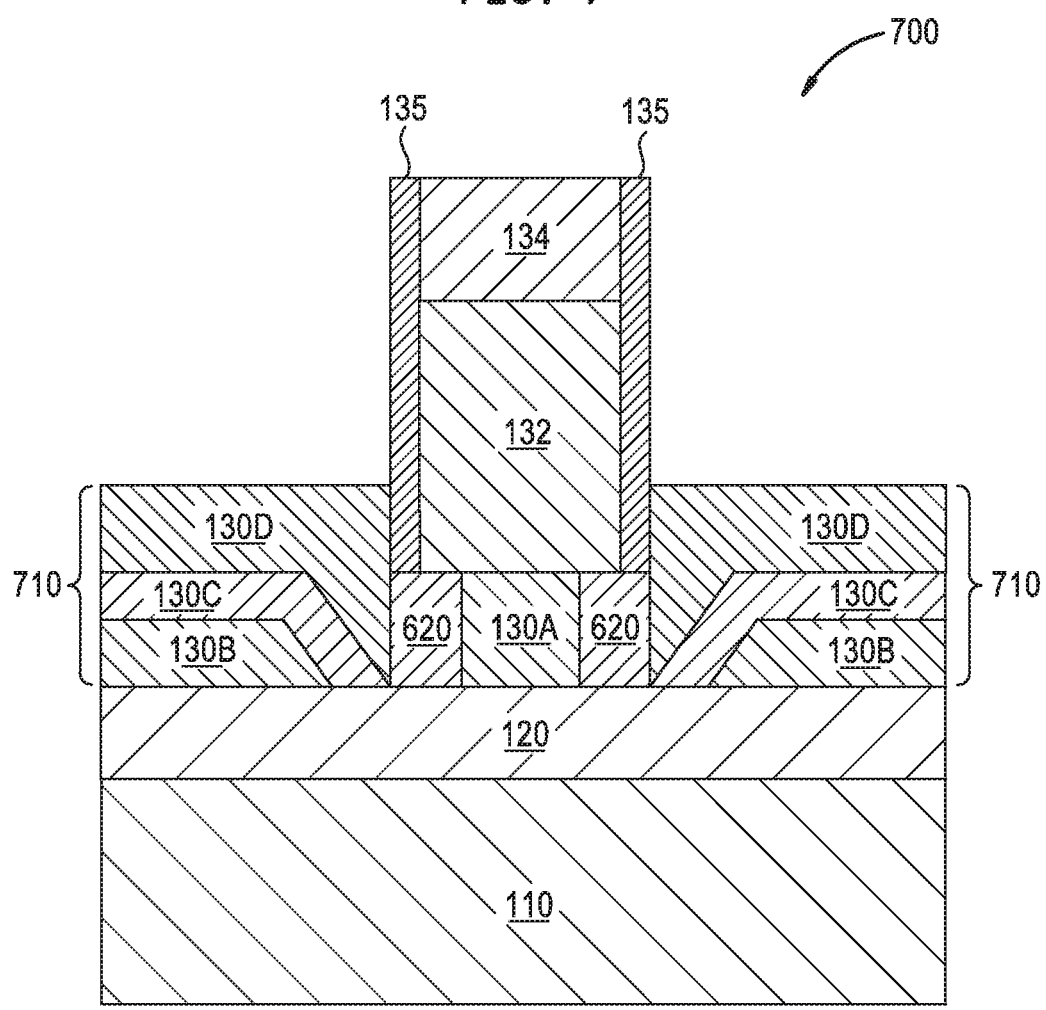
FIG. 7 illustrates forming an emitter and collector region in accordance with at least one embodiment of the present disclosure.

FIG. 7 illustrates epitaxially growing emitter and collector epitaxial layers on the structure 600, resulting in structure 700. The epitaxially grown layers 130D are epitaxially grown and in-situ doped on the exposed portions of the recessed device layer 130, e.g. the doped portions 130C of the emitter and collector, the facets 510 and the exposed vertical sides of the emitter/collector junctions 620 to form completed emitter and collector regions 710. In one embodiment, the emitter and collector epitaxial layers 130D can be, depending on the underlying seed layer, e.g. 130C, any suitable material, including but not limited to a doped Si or doped SiGe layer. In a Group IV type semiconductor embodiment, for a lateral NPN BJT the layer 130D may be n-doped in situ with phosphorous, arsenic, or antimony, and for a lateral PNP BJT the layer may be p-doped in situ with boron, aluminum, gallium, or indium. For an III-V type semiconductor embodiment, tellurium and/or selenium can be used for a lateral NPN BJT, and zinc and/or magnesium can be used for a lateral PNP BJT. Any other suitable dopants, including those mentioned elsewhere herein or otherwise suitable can be used. In one embodiment, the collector and emitter regions are heavily doped, where in one embodiment the concentration is $1\times10^{18}$ cm$^{-3}$ to $2\times10^{21}$ cm$^{-3}$.

Figure 8:
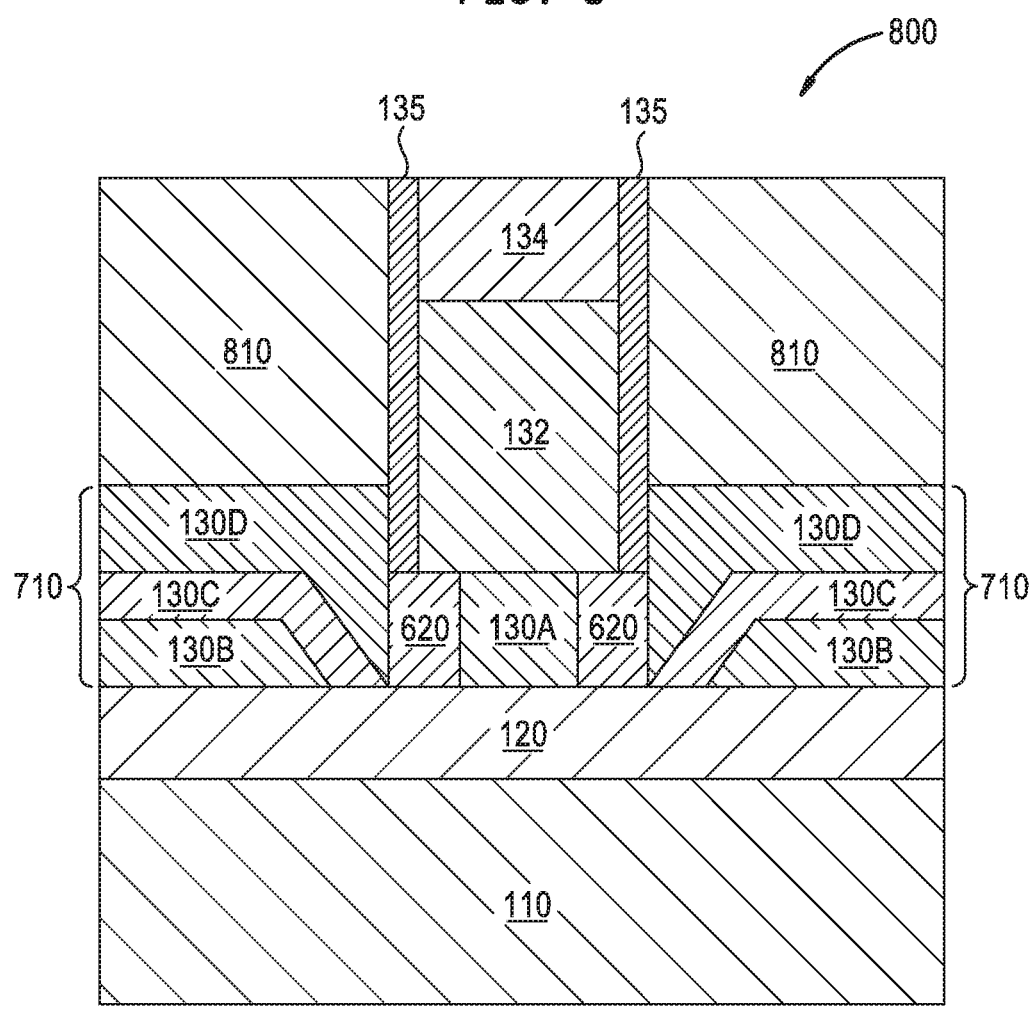
FIG. 8 illustrates forming an inter-layer dielectric material in accordance with at least one embodiment of the present disclosure.

FIG. 8 illustrates depositing an interlayer-dielectric material ("ILD") over the entire structure 700, thus forming a structure 800. The material of the ILD 810 can be any suitable ILD material, e.g. material, such as, a low-k dielectric material (with k<4.0), including but not limited to, borophosphosilicate glass (BPSG), spin-on-glass, silicon oxide, a flowable oxide, a high density plasma oxide, other silicon oxide compounds, or any combinations therefrom. ILD 810 can be formed by a suitable deposition technique, e.g. CVD. In the embodiment shown, the deposited ILD 810 is planarized using CMP in relation to the hard mask 134. In one embodiment, this is done prior to depositing the extrinsic base (discussed below), as described herein, so that deposition and planarization of the ILD 810 does not ultimately compromise or damage the extrinsic base. In this embodiment, the ILD 810 can also provide additional protection when depositing the extrinsic base.

FIG. 9 illustrates removing the hardmask 134 and dummy base 132 of structure 800 in order to form a structure 900 and enable formation of an extrinsic base. Both the hardmask 134 and the dummy base 132 can be removed using any suitable etch and removal process as described herein or otherwise known, including performing a CMP on the hardmask 134 until reaching the dummy base 132, and then performing a suitable wet etch technique on the dummy base 132, which creates opening 910 that enables deposition of an extrinsic base over intrinsic base 130A, e.g. epitaxially growing an extrinsic base over intrinsic base 130A, which was previously covered by the dummy base 132 and hardmask 134.

Figure 10A:
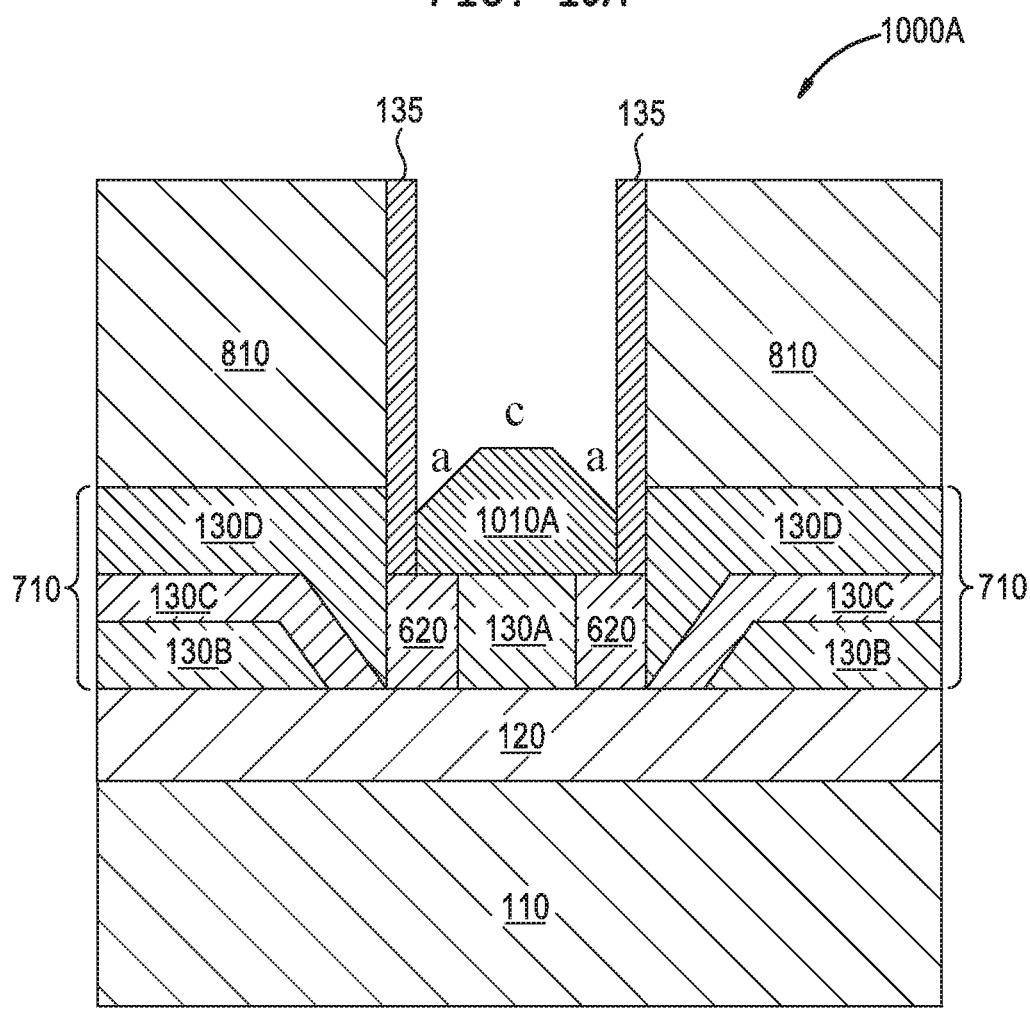
FIG. 10A illustrates forming an extrinsic base in accordance with at least one embodiment of the present disclosure.
Figure 10B:
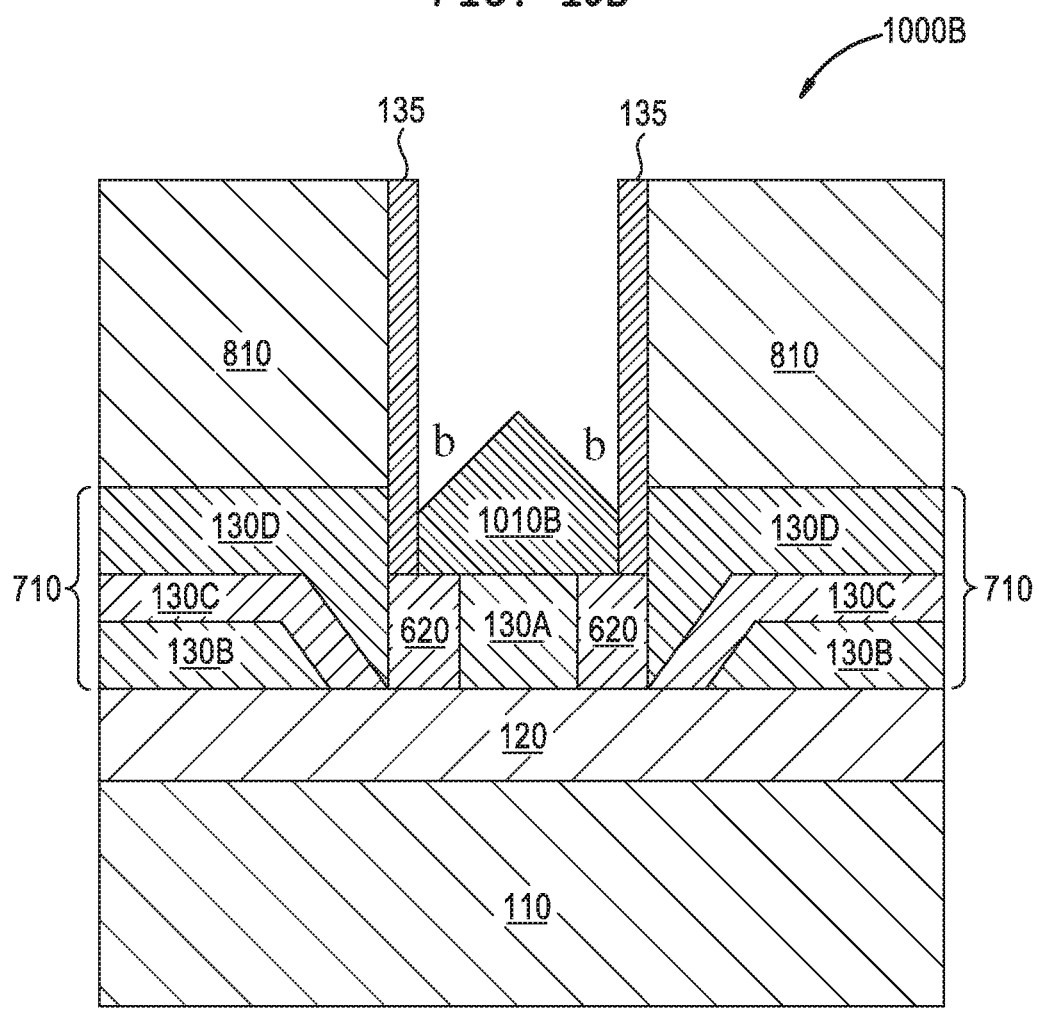
FIG. 10B illustrates forming an extrinsic base in accordance with at least one embodiment of the present disclosure.
Figure 10C:
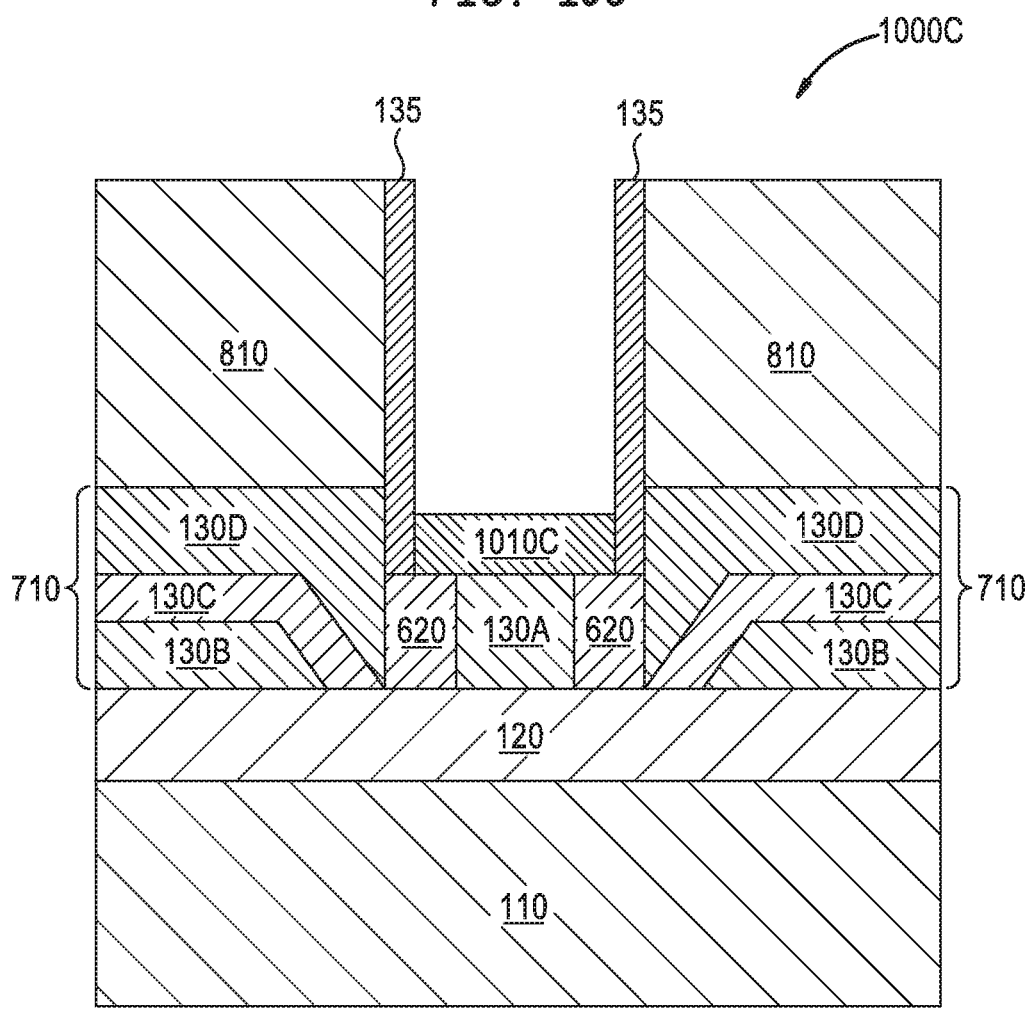
FIG. 10C illustrates forming an extrinsic base in accordance with at least one embodiment of the present disclosure.

FIGS. 10A, 10B, and 10C illustrate epitaxial growth of an extrinsic base over the structure 900, in order to form structures 1000, 1001, and 1002, respectively. In FIGS. 10A, 10B, and 10C an material that can be in an epitaxially relationship with respect to the intrinsic base 130A, e.g. the portion of layer 130 that remained in between and underneath spacers 135, is grown in opening 910 and over the intrinsic base 130A in order to form the extrinsic base, e.g. 1010A (note that extrinsic base 1010A, 1010B, and 1010C and extrinsic base 1010A, 1010B, and 1010C are referred to interchangeably herein). The epitaxial growth of the extrinsic base, e.g. 1010A, results in a single crystalline layer that offers various advantages over structures that use a polycrystalline extrinsic base, including superior current conduction in the final BJT structure. In one embodiment, the extrinsic base is doped using any suitable technique, e.g. in-situ doped, and at $1\times10^{18}$ cm$^{-3}$ to $1\times10^{21}$ cm$^{-3}$. The dopant type can be any suitable p-type or n-type dopant, as discussed herein or otherwise suitable, depending on the dopant of the intrinsic base, and the ultimate desired BJT structure, e.g. NPN or PNP BJT. Since the doping and annealing process occurs at this stage, as stated above, dopant diffusion is prevented between the intrinsic base and the extrinsic base.

In one embodiment, the extrinsic base material is selected such that it has a wider band gap than the material of the intrinsic base 130A, while still forming a single crystalline extrinsic base. For example, in one embodiment the extrinsic base 1010A can be a Si layer and the underlying intrinsic base 130A can be a SiGe layer. In one embodiment, the deposition or growth of the extrinsic base is such that it contacts a sidewall of each spacer 135.

In one embodiment, the extrinsic base 1010A is faceted, and has respective facets "a" neighboring the side spacers 135. In one embodiment, since the extrinsic base, e.g. 1010A is formed after formation of the intrinsic base (and other layer as indicated above), the epitaxial growth process can be controlled, e.g. as stated above by adjusting various factors associated with the process, including reactor temperature, pressure, timing, and precursor ratios and flows, to create facets and an orientation as necessary for the final structure. In FIG. 10A, the epitaxial process is set so as to produce facets "a" of extrinsic base 1010A, where facets "a" have a <111> crystallographic orientation where the extrinsic base has a <100> orientation "c" at the top.

In one embodiment, as shown in FIG. 10B, the epitaxial process is set so as to produce facets "b" of extrinsic base 1010B, where facets "b" have a <111> crystallographic orientation. In one embodiment, as shown in FIG. 10C, the epitaxial growth process is controlled so as to produce a flat or <100> crystallographic orientation. Generally, in one or more embodiments, the creation of facets "a" or "b" will involve a slower epitaxial deposition process that is terminated at a desired time when the facets are adequately developed, whereas the flat <100> orientation will involve a growth process that will prohibit the formation of facets.

As will be discussed below, the creation of facets provides greater flexibility in determining the contact area for the contacts that will go over and contact the extrinsic base, e.g. 1010A. That is to say, by forming the extrinsic base towards the end, the shape of the extrinsic base can be formed with the desired shape and contact area of the contacts capping the extrinsic base in mind.

Figure 11:
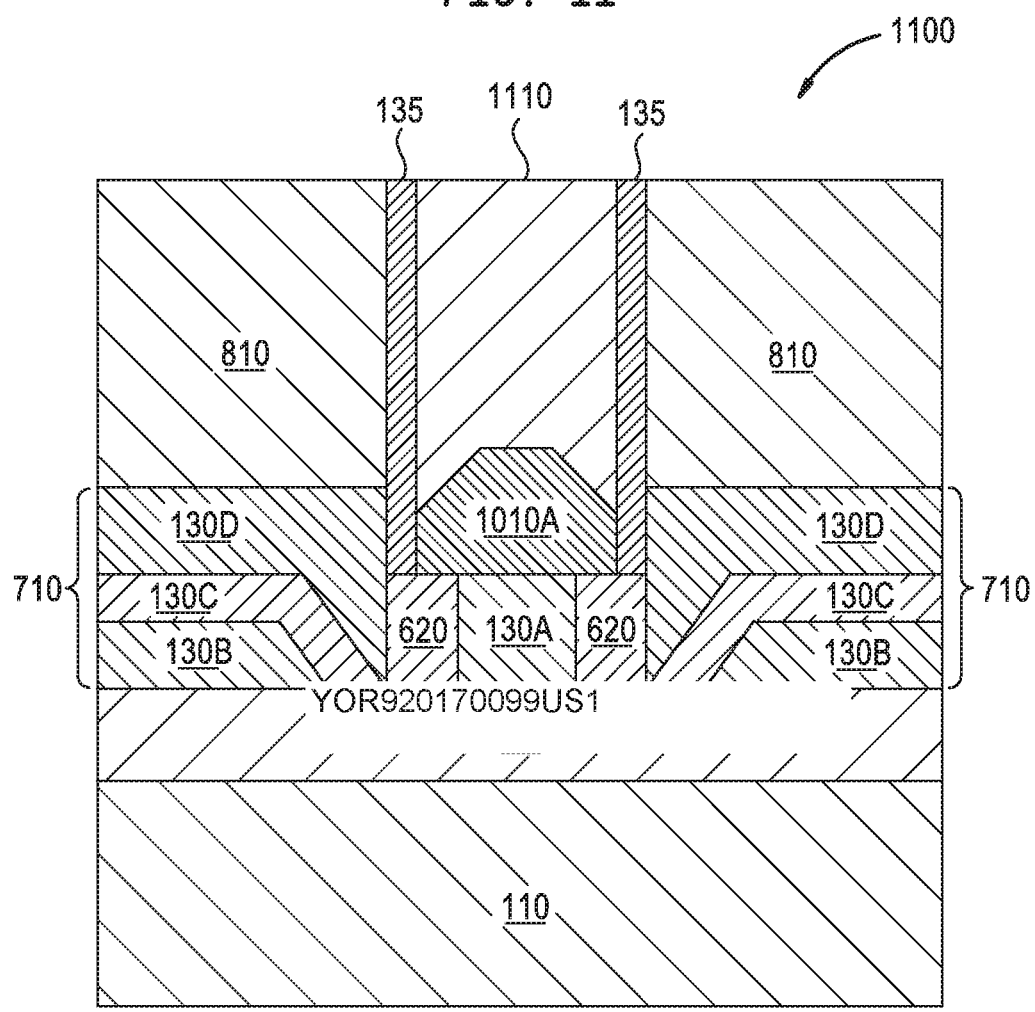
FIG. 11 illustrates a contact formation process in accordance with at least one embodiment of the present disclosure.

FIG. 11 illustrates performing a metallization process on structure 1000 (although the flow could be adjusted for 1001, 1002, or other suitable structures), and in order to form structure 1100. In one embodiment, a metal contact 1110 is formed by filling opening 910 with a metal silicide (not shown) over the extrinsic base, e.g. in this embodiment, extrinsic base 1010A is shown, and then forming a metal contact 1110 over the metal silicide. In one embodiment, metal silicide contacts (not shown) can be formed in the opening 910 prior to depositing contacts 1110 using a suitable silicidation or salicidation process. For example, a layer of refractory metal (not shown) is formed above 1010A. The refractory metal layer may comprise a variety of materials that may be subsequently converted to a metal silicide. For example, the refractory metal layer may comprise cobalt (Co), titanium (Ti), tantalum (Ta), tungsten (W), molybdenum (Mo), zirconium (Zr), platinum (Pt), nickel (Ni), and the like. The refractory metal layer may be formed by a variety of known techniques for forming such layers, such as, for example, a physical vapor deposition (PVD), sputtering, plasma enhanced chemical vapor deposition (PECVD), sputtering, LPCVD, and the like. The refractory metal layer may then be converted to metal silicide layers using suitable silicidation techniques.

After silicidation, the opening 910 may be filled, for example, by forming a layer of metals, e.g. 1110, and preferably, a combination of metals such as Cobalt (Co), aluminum (Al), platinum (Pt), gold (Au), tungsten (W), titanium (Ti), although other option are possible, including Titanium Nitride (TiN), and/or Titanium Aluminum (TiAl) over the metal silicide. The formation can occur using any suitable process, e.g. CVD, PECVD, PVD, plating, thermal or e-beam evaporation, and sputtering. In one embodiment, a multilayer metal stack utilizing one or more of the materials discussed herein may be used. Although, not shown, if necessary, a planarization process, for example, CMP, is performed to remove any conductive material from the surface of the ILD 810. In one embodiment, the metal contact 1110 is in contact with metal silicide, which in turns is in contact with the extrinsic base layer 1010A. As shown, the facets of structure 1010A, i.e. facets "a," determine the metal silicide shape, and by extension the metal contact 1110 shape and contact area, as the topography of the extrinsic base necessitates the shape of the metal contact 1110. Consistent with the teachings of the present disclosure, and depending on ultimate device and design needs, the process can be adjusted (as described above) to use different shapes/facets and thus have a different contact area and contact shape.

Figure 12:
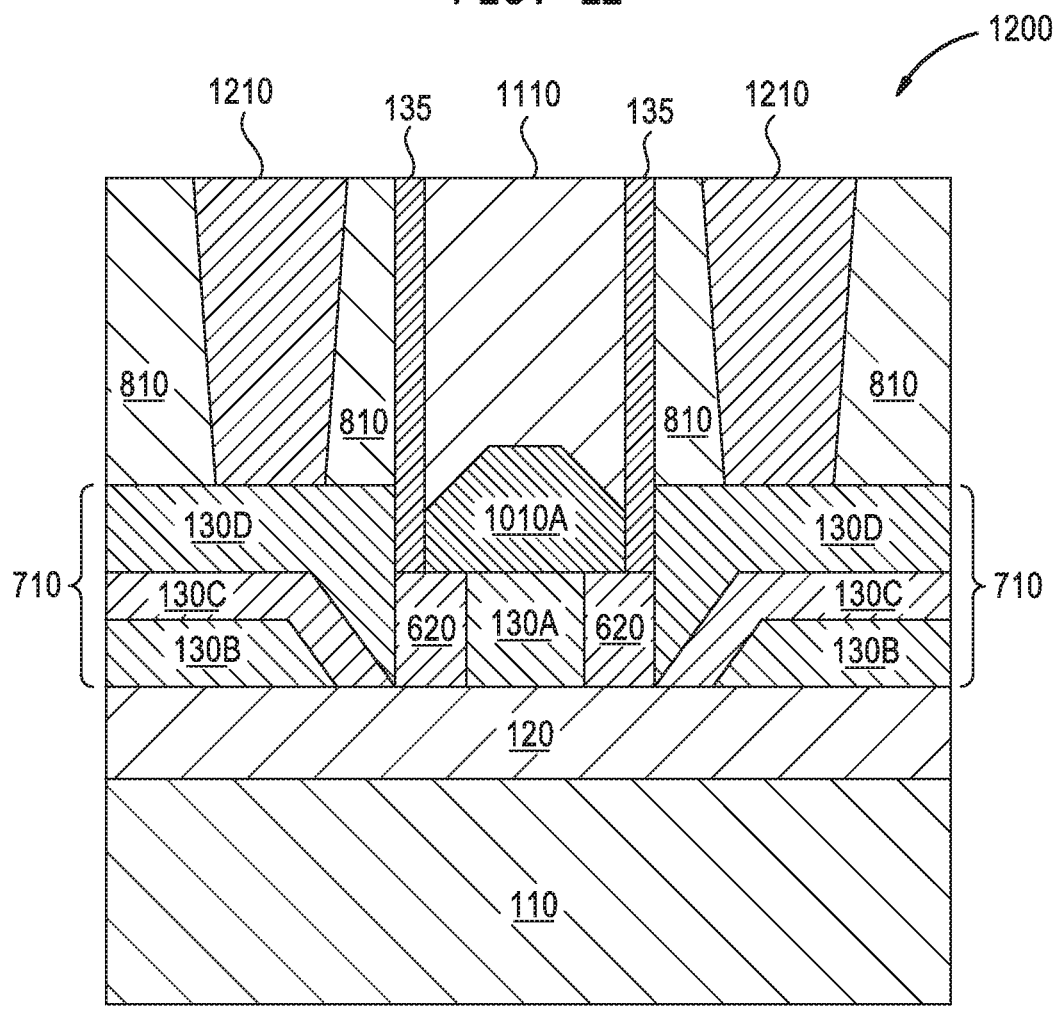
FIG. 12 illustrates a contact formation process in accordance with at least one embodiment of the present disclosure.

FIG. 12 illustrates performing a contact formation process, e.g. on structure 1100, in order to form structure 1200. In one embodiment, contacts 1210 extend from the surface of the ILD 810 to emitter and collector regions 710. The contacts 1210 are formed by patterning a trench (not shown) in the ILD 810, and, in order to remove relevant portions of the ILD 810, a resist (not shown), such as a photoresist, may be deposited and patterned. An etch process, such as a ME, may be performed using the patterned resist as an etch mask to remove the ILD 810 portions until the emitter and collector regions 710 are exposed. The contact trenches (not shown) are filled with a conductive material or a combination of conductive materials. As above, prior to depositing the contacts 1210, a silicidation process can be used to form metal silicide contacts (not shown), which in turn can be formed using a suitable silicidation or salicidation process can be employed. For example, as above, a layer of refractory metal (not shown) is formed above the emitter and collector regions 710. The refractory metal layer may comprise a variety of materials that may be subsequently converted to a metal silicide. For example, the refractory metal layer may comprise cobalt (Co), titanium (Ti), tantalum (Ta), tungsten (W), molybdenum (Mo), zirconium (Zr), platinum (Pt), nickel (Ni), and the like. The refractory metal layer may be formed by a variety of known techniques for forming such layers, such as, for example, a physical vapor deposition (PVD), sputtering, plasma enhanced chemical vapor deposition (PECVD), sputtering, LPCVD, and the like. The refractory metal layer may then be converted to metal silicide layers using suitable silicidation techniques. In one embodiment, after formation of the metal silicide, a conductive material 1210 is deposited thereon. The conductive material may be a conductive metal, for example, Cobalt (Co), aluminum (Al), platinum (Pt), gold (Au), tungsten (W), titanium (Ti), or any combination thereof. The conductive material may be deposited by a suitable deposition process, for example, CVD, PECVD, PVD, plating, thermal or e-beam evaporation, or sputtering. A planarization process, for example, CMP, is performed to remove any conductive material from the surface of the ILD 810. According to one embodiment, and as shown in one aspect of FIG. 12, the structure 1200 is a structure where spacers 135 extend over both intrinsic base 130A and extrinsic base 1010A, resulting in contacts 1210 being over the extrinsic base. A planarization process, for example, CMP, can be performed to remove any conductive material from the surface of the ILD 810. According to one embodiment, and as shown in one aspect of FIG. 12, the structure 1200 is a structure where spacers 135 extend over both intrinsic base 130A and extrinsic base 1010A.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

While the foregoing is directed to embodiments of the present invention, other and further embodiments of the invention may be devised without departing from the basic scope thereof, and the scope thereof is determined by the claims that follow.

What is claimed is:

1. A method for forming a bipolar transistor (BJT) structure comprising:
   providing a substrate having an insulator layer formed thereon and a device layer on the insulator layer;
   forming an intrinsic base in the device layer by etching the device layer to the insulator layer;
   forming emitter and collector regions directly on the insulator layer and in the device layer on opposing sides of the intrinsic base; and after forming i) the intrinsic base and ii) the emitter and collector regions, depositing a single crystalline extrinsic base stacked over and directly contacting the intrinsic base.

2. The method of claim 1 further comprising, before depositing the extrinsic base:
forming a dummy base, with a hardmask thereon, over the device layer; and
forming a plurality of spacers on at least two sidewalls of the dummy base.

3. The method of claim 2 further comprising, before depositing the extrinsic base:
depositing a dummy layer over the device layer, wherein the dummy layer has a facet associated with each side of the dummy base.

4. The method of claim 3 further comprising:
recessing the dummy layer, wherein the recessing forms the intrinsic base and each of the emitter and collector regions.

5. The method of claim 4, wherein forming the emitter and collector regions further comprises:
doping a portion of the intrinsic base utilizing an angled ion implantation process to form one or more implant junctions; and
epitaxially growing emitter and collector layers over each of the emitter and collector regions.

6. The method of claim 2, wherein depositing the extrinsic base over the intrinsic base comprises:
removing both the hardmask and the dummy base to form an opening for epitaxial deposition of the extrinsic base.

7. The method of claim 6, wherein forming the extrinsic base the intrinsic base further comprises:
epitaxially growing, via the opening, the single crystalline extrinsic base over the intrinsic base.

8. The method of claim 6, wherein the intrinsic base and the extrinsic base are in an epitaxial relationship with respect to one another, and wherein the extrinsic base has a wider band-gap than the intrinsic base.

9. The method of claim 6 further comprising:
forming one or more facets for the extrinsic base when epitaxially growing the extrinsic base.

10. The method of claim 2 further comprising:
prior to depositing the extrinsic base, forming an inter-layer dielectric (ILD) material over the structure; and
performing chemical-mechanical planarization (CMP) on the structure to planarize the ILD in relation to the hardmask.

11. A bipolar junction transistor (BJT) structure comprising:
a substrate having an insulator layer formed thereon and a device layer formed on the insulator layer;
an intrinsic base formed in the device layer, the intrinsic base comprising emitter and collector junctions on opposing sides of the intrinsic base;
a plurality of spacers over the intrinsic base;
emitter and collector regions formed directly on the insulator layer and in the device layer on opposing sides of the intrinsic base, the emitter and collector regions in direct contact with the emitter and collector junctions; and
a single crystalline extrinsic base stacked over and directly contacting the intrinsic base.

12. The BJT structure according to claim 11, wherein the single crystalline extrinsic base has one or more facets.

13. The BJT structure according to claim 12 further comprising:
a metal silicide contact in contact with the extrinsic base, wherein a contact area of the metal silicide contact is determined by the one or more facets.

14. The BJT structure according to claim 12, wherein all of the one or more facets have one of a i) <111> crystallographic orientation and ii) a <100> crystallographic orientation.

15. The BJT structure according to claim 11, wherein the extrinsic base contacts a sidewall of each of the plurality of spacers without contacting a lateral side wall of the intrinsic base.

16. The BJT structure according to claim 11 further comprising:
an inter-layer dielectric (ILD) material over the emitter and collector regions; and
a plurality of contacts in contact with each of the emitter and collector regions.

17. The BJT structure according to claim 11, wherein semiconductor material of the extrinsic base has a wider band gap than semiconductor material of the intrinsic base.

18. The BJT structure according to claim 17, wherein both the extrinsic base and one or more junctions in contact with the intrinsic base are doped with at least one of an n-type dopant and a p-type dopant.

19. The BJT structure according to claim 18, wherein the intrinsic base is between 1 nm to 15 nm in length and wherein the extrinsic base is between 12 nm and 17 nm in length.

20. A method, comprising:
providing a substrate having an insulator layer;
forming an intrinsic base on the insulator layer by etching a device layer to the insulator layer;
forming emitter and collector regions directly on the insulator layer and on opposing sides of the intrinsic base; and
after forming the intrinsic base and the emitter and collector regions, depositing a single crystalline extrinsic base stacked over and directly contacting the intrinsic base.

* * * * *